United States Patent
Bai et al.

(10) Patent No.: US 8,518,772 B2
(45) Date of Patent: Aug. 27, 2013

(54) FABRICATING METHOD OF SEMICONDUCTOR DEVICE

(75) Inventors: Keun-Hee Bai, Suwon-si (KR); Hyo-San Lee, Suwon-si (KR); Dong-Seok Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 19 days.

(21) Appl. No.: 13/117,478

(22) Filed: May 27, 2011

(65) Prior Publication Data

US 2011/0306204 A1     Dec. 15, 2011

(30) Foreign Application Priority Data

Jun. 11, 2010   (KR) .................. 10-2010-0055688

(51) Int. Cl.
  *H01L 21/8242*   (2006.01)
(52) U.S. Cl.
  USPC ........................................................ 438/253
(58) Field of Classification Search
  USPC ........................................................ 438/253
  See application file for complete search history.

(56) References Cited

U.S. PATENT DOCUMENTS

| 6,329,263 B1* | 12/2001 | Durcan et al. ............. 438/387 |
| 6,593,217 B1* | 7/2003 | Fujisawa ..................... 438/495 |
| 2002/0022320 A1* | 2/2002 | DeBoer et al. ............. 438/255 |
| 2004/0082162 A1* | 4/2004 | Kang et al. ................. 438/629 |
| 2004/0129967 A1* | 7/2004 | Kim et al. .................. 438/255 |
| 2006/0024883 A1* | 2/2006 | Hwang ....................... 438/253 |
| 2009/0289326 A1* | 11/2009 | Park et al. ................. 257/532 |
| 2010/0159700 A1* | 6/2010 | Eun ............................ 438/694 |

FOREIGN PATENT DOCUMENTS

| JP | 2006-203255 A | 8/2006 |
| KR | 10-2005-051957 A | 6/2005 |
| KR | 10-2006-076010 A | 7/2006 |

* cited by examiner

*Primary Examiner* — Charles Garber
*Assistant Examiner* — Andre' C Stevenson
(74) *Attorney, Agent, or Firm* — Lee & Morse, P.C.

(57) ABSTRACT

A fabricating method of a semiconductor device includes forming an interlayer insulation layer on a substrate, the interlayer insulation layer including a storage node contact plug, forming an etch stop layer on the interlayer insulation layer, the etch stop layer including a silicon layer or a silicon germanium layer, forming a molding insulation layer on the etch stop layer, forming a hole in the molding insulation layer by selectively etching the molding insulation layer until a portion of the etch stop layer is exposed, forming a first conductive layer conformally on an inner surface of the hole and on a top surface of the molding insulation layer, and forming a metal silicide pattern in a predetermined area of the etch stop layer exposed by the molding insulation layer by annealing the first conductive layer and the etch stop layer.

18 Claims, 16 Drawing Sheets

FABRICATING METHOD OF SEMICONDUCTOR DEVICE

CROSS-REFERENCE TO RELATED APPLICATION

This application claims priority from Korean Patent Application No. 10-2010-0055688 filed on Jun. 11, 2010 in the Korean Intellectual Property Office, and all the benefits accruing therefrom under 35 U.S.C. 119, the contents of which in its entirety are herein incorporated by reference.

BACKGROUND

1. Field

Example embodiments relate to a fabricating method of a semiconductor device.

2. Description of the Related Art

With the advances in the semiconductor technology, sizes of transistors are being decreased and semiconductor devices are becoming highly integrated. For example, in accordance with an increased integration level of DRAMs (Dynamic Random Access Memories), a unit cell area of a semiconductor memory device may be decreased.

The DRAM may include a transistor and a capacitor. The capacitor may be classified, e.g., into a stack type capacitor and a trench type capacitor according to the formation method.

For example, as the design rule decreases, in order to obtain a desired level of capacitance in a small area, the DRAM having a stack type capacitor may include a storage node electrode with an increased height or one cylinder storage (OCS) electrode utilizing both inner and outer surfaces. As such, an effective surface area of the storage electrode may increase, e.g., using a hemispherical grain (HSG).

SUMMARY

According to embodiments, a fabricating method of a semiconductor may be provided. The method may include forming an interlayer insulation layer on a substrate, the interlayer insulation layer including a storage node contact plug, forming an etch stop layer on the interlayer insulation layer, the etch stop layer including a silicon layer or a silicon germanium layer, forming a molding insulation layer on the etch stop layer, forming a hole in the molding insulation layer by selectively etching the molding insulation layer until a portion of the etch stop layer is exposed, forming a first conductive layer conformally on an inner surface of the hole and on a top surface of the molding insulation layer, and forming a metal silicide pattern in a predetermined area of the etch stop layer exposed by the molding insulation layer by annealing the first conductive layer and the etch stop layer.

Forming the first conductive layer may include forming a metal layer.

Forming the metal layer may include depositing at least one layer of Ru, Ir, Ti, TiN, Co, Rh, Os, Pd, Pt, W, Mo, Ta, TaN, Al, and Cu.

Forming the first conductive layer may include forming the first conductive layer in direct contact with the predetermined area of the etch stop layer exposed by the molding insulation layer.

The annealing may be performed by a rapid thermal nitridation (RTN) process under a nitrogen ($N_2$) atmosphere at a temperature in a range of about 500° C. to about 900° C.

The fabricating method may further include, after forming the hole in the molding insulation layer, enlarging the hole by an isotropic etching process.

The fabricating method may further include, after forming the metal silicide, forming a sacrificial capping layer on the first conductive layer, removing portions of the sacrificial capping layer and the first conductive layer by a planarization process until the molding insulation layer is exposed, removing the molding insulation layer and residues of the sacrificial capping layer remaining in the hole, and removing a predetermined region of the etch stop layer not reacting with the first conductive layer.

Removing the predetermined region of the unreacted etch stop layer may include performing wet etching using a $NH_3$ based etching solution.

Removing the predetermined region of the unreacted etch stop layer may include performing dry etching using $CF_4/O_2$ gas or HBr gas.

Forming the molding insulation layer may include sequentially forming a first molding insulation layer and a second molding insulation layer on the etch stop layer.

The fabricating method may further include, after forming the hole in the molding insulation layer, enlarging the hole by wet etching.

Enlarging the hole may include using a wet etching solution having different etching selectivity with respect to each of the first and second molding insulation layers.

Enlarging the hole may be performed using fluoric acid, APM (ammonium peroxide mixture), or a buffered oxide etchant (BOE) containing a mixture of HF and $NH_4F$.

Forming the first and second molding insulation layers may include sequentially forming silicon oxide layers with different impurity concentrations.

Forming each of the first and second molding insulation layers may include using BPSG (Boron Phosphorus Silicate Glass), PSG (Phosphorus Silicate Glass), PE-TEOS (Plasma Enhanced Tetra Ethyl Ortho Silicate), HDP (High Density Plasma) oxide, or $P-SiH_4$ oxide.

The fabricating method may further include, after forming the metal silicide pattern, forming a second conductive layer on the first conductive layer.

The fabricating method may further include, after forming the metal silicide pattern and before forming the second conductive layer, removing the first conductive layer.

Forming the second conductive layer may include depositing a metal layer or an impurity doped conductive silicon layer.

According to other embodiments, a fabricating method of a semiconductor may include forming an interlayer insulation layer on a substrate, the interlayer insulation layer including a storage node contact plug, forming an etch stop layer on the interlayer insulation layer, forming a molding insulation layer on the etch stop layer, forming a hole through the molding insulation layer, such that a portion of the etch stop layer is exposed through the hole, conformally forming a conductive layer on an inner surface of the hole, such that the conductive layer contacts the exposed etch stop layer, and annealing the conductive layer with the etch stop layer, such that a metal silicide pattern is formed between the conductive layer and the storage node contact plug of the interlayer insulation layer. Forming the hole in the molding insulation layer may include forming a bottom of the hole and a bottom of the molding insulation layer substantially level.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
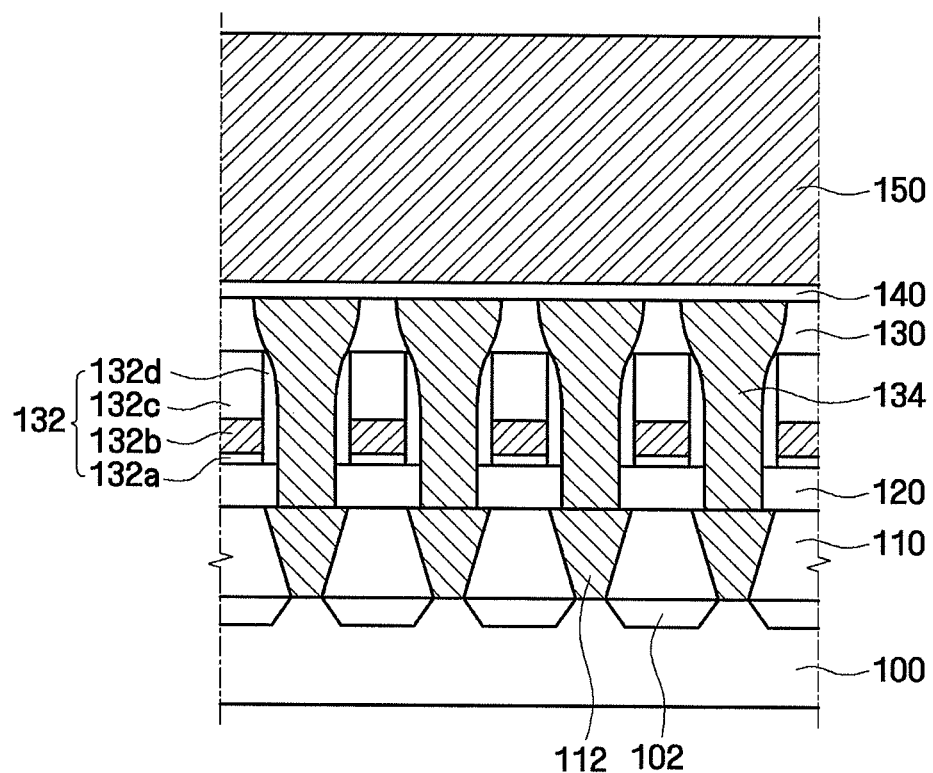
FIGS. 1 through 9 illustrate cross-sectional views of process steps in a fabricating method of a semiconductor device according to an embodiment.

Korean Patent Application No. 10-2010-0055688, filed on Jun. 11, 2010, in the Korean Intellectual Property Office, and entitled: "Fabricating Method of Semiconductor Device," is incorporated by reference herein in its entirety.

Advantages and features of example embodiments and methods of accomplishing the same may be understood more readily by reference to the following detailed description of preferred embodiments and the accompanying drawings. The example embodiments may, however, be embodied in many different forms and should not be construed as being limited to the embodiments set forth herein. Rather, these embodiments are provided so that this disclosure will be thorough and complete and will fully convey the concept of the invention to those skilled in the art, and the example embodiments will only be defined by the appended claims. In the drawings, the size and relative sizes of layers and regions may be exaggerated for clarity. Like reference numerals refer to like elements throughout.

As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "between," or "connected to" another element or layer, it can be directly on, between, or connected to the other element or layer, or intervening elements or layers may be present. In contrast, when an element is referred to as being "directly on," "directly between," or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

Hereinafter, a fabricating method of a semiconductor device according to an embodiment will be described in detail with reference to FIGS. 1 through 9. FIGS. 1 through 9 illustrate cross-sectional views of process steps of a fabricating method of a semiconductor device according to an embodiment.

First, referring to FIG. 1, a gate electrode (not shown) may be formed on the substrate 100 having a field region and an active region device defined by an isolation layer 102, and an impurity region (not shown) may be formed in the substrate 100 by performing ion implantation into both sides of the gate electrode. The substrate 100 may be a substrate made of at least one semiconductor material, e.g., at least one of Si, Ge, SiGe, GaP, GaAs, SiC, SiGeC, InAs, InP, and a SOI (Silicon On Insulator) substrate, but is not limited thereto.

Subsequently, an insulating material may be deposited on the substrate 100 having the gate electrode (not shown) and the impurity region (not shown). Then, a chemical mechanical polishing (CMP) process or an etch back process may be performed to planarize a top surface of the deposited insulating material to form a first interlayer insulation layer 110 on the substrate 100.

Next, a general photolithography process may be performed on the first interlayer insulation layer 110 to form contact holes exposing the impurity regions in the substrate 100. When the contact holes are formed through he first interlayer insulation layer 110, e.g., a silicon oxide layer, an etching gas having high etching selectivity with respect to the gate electrode may be used, so that the contact holes are self-aligned with respect to the gate electrode and expose the impurity regions in the substrate 100.

Next, a conductive layer may be formed on the interlayer insulation layer 110 by depositing a conductive polysilicon layer doped with high-concentration impurity or a metal layer on the entire surface of the first interlayer insulation layer 110 and in the contact holes. Subsequently, the conductive layer is planarized until a top surface of the first interlayer insulation layer 110 is exposed, such that portions of the conductive layer in the contact holes of the interlayer insulation layer 110 may form self-aligned contact pads 112 in the first interlayer insulation layer 110.

Then, an insulating material may be deposited on the first interlayer insulation layer 110 including the contact pad 112, followed by planarization to form a second interlayer insulation layer 120. Then, a contact hole for a bit line may be formed in the second interlayer insulation layer 120, and a conductive material may be deposited in the contact hole of the second interlayer insulation layer 120 to form a contact plug (not shown) for a bit line in the second interlayer insulation layer 120. Here, the contact plug for the bit line may be selectively connected to the contact pad 112 positioned in the first interlayer insulation layer 110.

Next, a bit line 132 connected to the contact plug (not shown) for the bit line may be formed on the second interlayer insulation layer 120. In more detail, the bit line 132 may have a stacked structure of a diffusion preventing layer 132a, a metal layer 132b, and an insulation layer 132c, and a spacer 132d may be formed at sidewalls of the stacked structure. For example, the diffusion preventing layer 132a may be formed of a Ti/TiN layer, and the metal layer 132b may be formed of a tungsten (W) layer. In addition, the insulation layer 132c and the spacer 132d may be formed of a nitride layer. In another example, the bit line 132 may be formed of a conductive polysilicon layer doped with high-concentration impurity, instead of the diffusion preventing layer 132a and the metal layer 132b.

As described above, the bit line 132 may be formed on the second interlayer insulation layer 120. An insulating material may be deposited on the entire surface of the second interlayer insulation layer 120 to fill the bit line 132, followed by planarization of the insulating material, thereby forming a third interlayer insulation layer 130.

Thereafter, a general photolithography process may be performed on the second and third interlayer insulation layers 120 and 130 to form a contact hole exposing the contact pad 112 in the first interlayer insulation layer 110. The contact hole may be filled with a conductive material or a metallic material and planarized, thereby forming a storage node contact plug 134 in contact with the contact pad 112. It is noted that a top portion of the contact hole, i.e., a portion of the contact hole formed in atop portion of the third interlayer insulating layer 130, may be increased in order to increase a contact area between the storage node contact plug 134 and a storage node electrode (181 of FIG. 6) formed thereon subsequently.

Next, an etch stop layer 140 and a molding insulation layer 150 covering the third interlayer insulation layer 130 and the storage node contact plug 134 may be sequentially formed on the third interlayer insulation layer 130. Portions of the molding insulation layer 150 may be removed in regions overlapping the storage node contact plug 134, as will be discussed below in more detail with reference to FIG. 2

The etch stop layer 140 may be formed for the purpose of terminating a subsequent etching process of the molding insulation layer 150, and may be made of a material having different etching selectivity with respect to the molding insulation layer 150. For example, the etch stop layer 140 may be formed of a silicon (Si) layer or a silicon germanium (SiGe) layer, e.g., the silicon (Si) layer or the silicon germanium (SiGe) layer may or may not be impurity doped.

The etch stop layer 140 may be formed, e.g., by chemical vapor deposition (CVD). For example, a silicon source gas may be at least one of $SiH_4$, $SiH_2Cl_2$, $SiHCl_3$, $SiCl_4$, $SiH_xCl_y$, (x+y=4), $Si(OC_4H_9)_4$, $Si(OCH_3)_4$, $Si(OC_2H_5)_4$, etc., a germanium source gas may be at least one of $GeH_4$, $GeCl_4$, $GeH_xCl_y$ (x+y=4), etc., and an impurity doped gas may be $PH_3$, $BH_3$, etc. However, example embodiments are not limited to the listed examples. The etch stop layer 140 may be formed to a thickness of about 100 Å to about 600 Å.

The molding insulation layer 150 may be based on a silicon oxide layer, e.g., the molding insulation layer 150 may include a BPSG (Boron Phosphorus Silicate Glass) layer, a PSG (Phosphorus Silicate Glass) layer, a PE-TEOS (Plasma Enhanced Tetra Ethyl Ortho Silicate layer, a HDP (High Density Plasma) oxide layer, a P-$SiH_4$ oxide layer, and so on.

Figure 2:
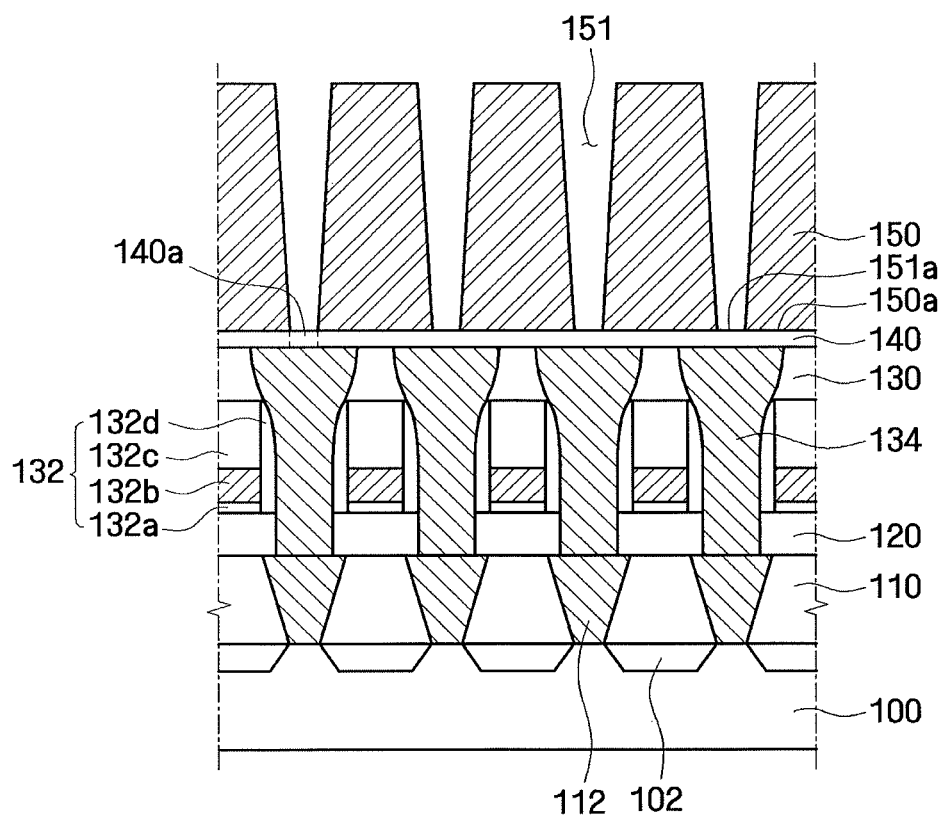

Next, referring to FIG. 2, a mask for forming a hole 151, i.e., a hole for a storage node electrode 151, may be formed on the molding insulation layer 150, and the molding insulation layer 150 may be selectively etched using the mask, thereby forming the hole 151. The hole 151 may pass through the molding insulation layer 150 to expose an upper surface of the etch stop layer 140, and may correspond to a predetermined region of the storage node contact plug 134.

The hole 151, i.e., the storage node electrode forming hole 151, may be formed, e.g., by anisotropic dry etching. For example, the anisotropic dry etching may be performed using a $C_xF_y$ based etching gas, e.g., $C_4F_6$ or $C_3F_8$, but not limited thereto. The etching of the molding insulation layer 150 may be terminated by the etch stop layer 140, and the storage node electrode forming hole 151 may be formed within the molding insulation layer 150 only. That is, a bottom 151a of the hole 151 may be substantially level with a bottom 150a of the molding insulation layer 150, so a top surface of the etch stop layer 140, i.e., a surface of the etch stop layer 140 facing away from the substrate 100, may be substantially flat and parallel to a bottom of the substrate 100.

The storage node electrode forming hole 151 formed within the molding insulation layer 150 may have a predetermined slope downward due to limitation of drying etching, as shown in FIG. 2. For example, as illustrated in FIG. 2, a top of the hole 151, i.e., a region facing away from the substrate 100, may be wider than a bottom of the hole 151, i.e., a region directly on the etch stop layer 140.

Figure 3:
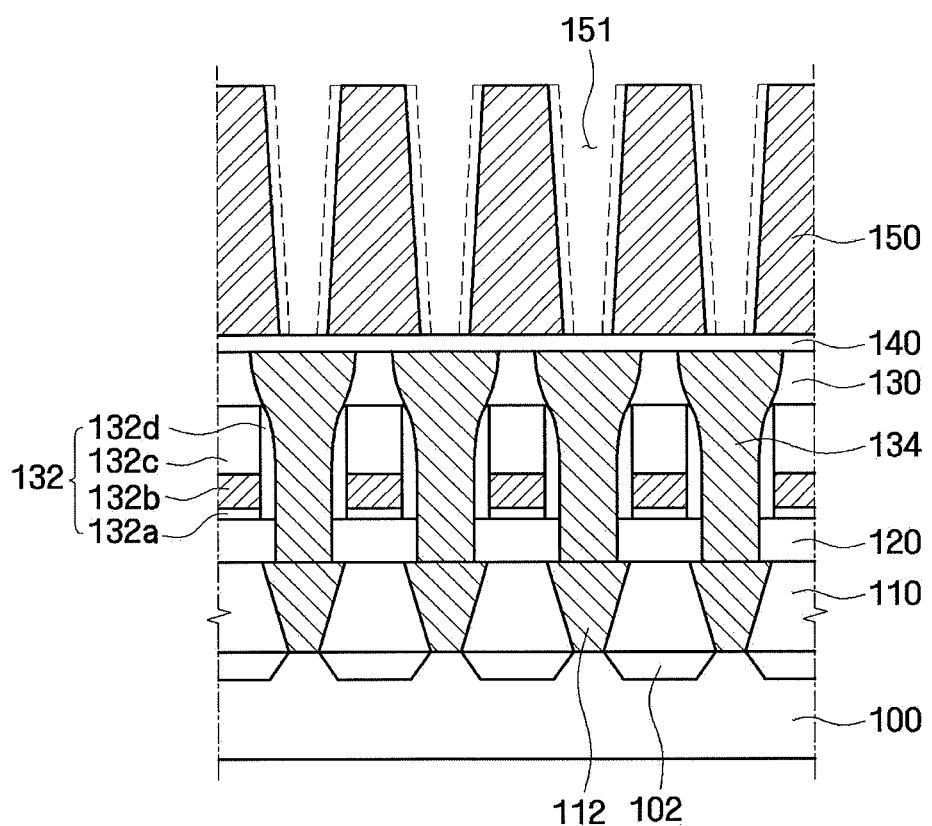

Referring to FIG. 3, the storage node electrode forming hole 151 formed in the molding insulation layer 150 may be enlarged, e.g., via isotropic etching. For example, as illustrated by the dashed lines in FIG. 3, the width of the storage node electrode forming hole 151 may be uniformly increased, e.g., across an entire depth and diameter of the hole 151. For example, the isotropic etching may be performed by using fluoric acid, APM (ammonium peroxide mixture), e.g., SC–1 ($NH_4OH+H_2O_2$+deionized water), or a buffered oxide etchant (BOE) containing a mixture of HF and $NH_4F$. As the storage node electrode 181 will be subsequently formed in the storage node electrode forming hole 151 (FIG. 6), enlargement of the bottom of the storage node electrode forming hole 151 may provide an increased area for forming an increased storage node electrode 181, as will be discussed in more detail below.

Figure 4:
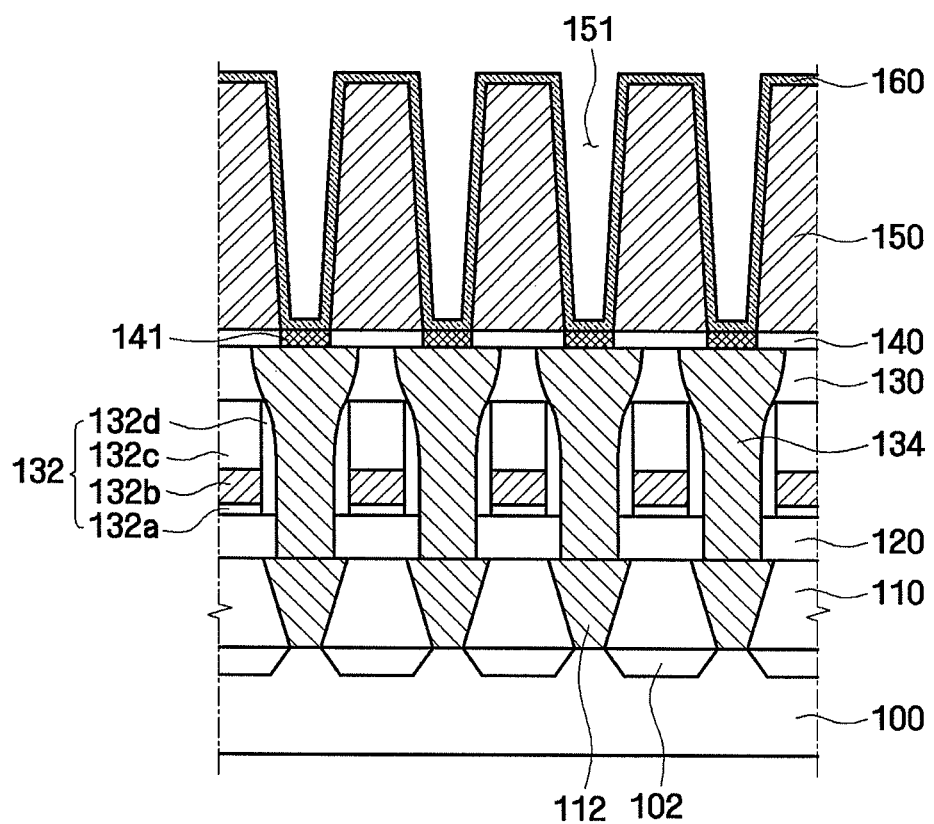

Referring to FIG. 4, a conductive layer 160 for forming a storage node electrode may be formed conformally on the inner surface of the storage node electrode forming hole 151 and the top surface of the molding insulation layer 150. The conductive layer 160 for forming a storage node electrode may be formed of a metal layer, e.g., a single layer of Ru, Ir, Ti, TiN, Co, Rh, Os, Pd, Pt, W, Mo, Ta, TaN, Al, or Cu, or a composite layer thereof. The conductive layer 160 may be formed by a deposition method, e.g., CVD, ALD (Atomic Layer Deposition), or PVD (Physical Vapor Deposition). The conductive layer 160 for a storage node electrode may directly contact a predetermined area 140a of the etch stop layer 140 exposed by the storage node electrode forming hole 151.

Subsequently, annealing may be performed on the substrate 100 having the conductive layer 160 for a storage node electrode. That is, as the conductive layer 160 and the etch stop layer 140 are in direct contact at the bottom of the storage node electrode forming hole 151, a portion of the etch stop layer 140 contacting the conductive layer 160 may interact with the conductive layer 160 during the annealing, thereby forming a metal silicide pattern 141 in the predetermined area 140a of the etch stop layer 140. In other words, as illustrated in FIG. 4, an entire portion of the etch stop layer 140 overlapping the bottom of the storage node electrode forming hole 151 and contacting the conductive layer 160 may chemically react and transform into the silicide pattern 141 under high temperature, i.e. annealing. Therefore, the silicide pattern 141 and the bottom 151a of the storage node electrode forming hole 151 may completely overlap each other, and the silicide pattern 141 may contact, e.g., directly contact, the top of the storage node contact plug 134.

In detail, since the etch stop layer 140 is formed of a silicon layer or a silicon germanium layer, silicon included in the etch stop layer 140 and the metal included in the conductive layer 160 for a storage node electrode may interact during the annealing to form a metal silicide. The metal silicide pattern 141 may overlap and directly contact a predetermined area of the storage node contact plug 134. The conductive layer 160 for forming a storage node electrode and the storage node contact plug 134 may form an ohmic contact using the metal silicide pattern 141. The annealing may be performed, e.g., by a rapid thermal nitridation (RTN) process under a nitrogen ($N_2$) atmosphere at a temperature in a range of about 500° C. to about 900° C.

According to example embodiments, as the storage node electrode forming hole 151 is not formed in the etch stop layer 140, i.e., the hole 151 is formed only within the mold insulation layer 150, the storage node electrode forming hole 151 may be prevented from shrinking in the etch stop layer 140. In addition, the predetermined area 140a of the etch stop layer 140 exposed by the storage node electrode forming hole 151 may be formed into the metal silicide pattern 141, thereby reducing contact resistance between the storage node contact plug 134 and the conductive layer 160 for forming a storage node electrode.

Figure 5:
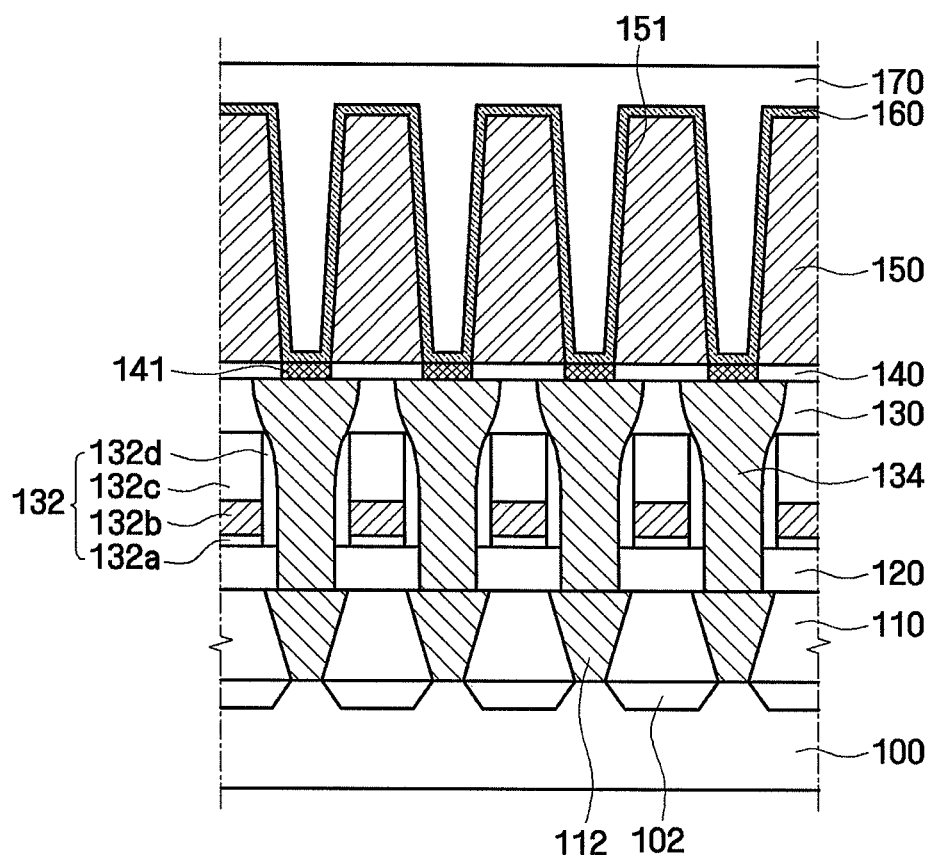

Referring to FIG. 5, a sacrificial capping layer 170 having a top surface higher than the conductive layer 160 for forming a storage node electrode may be formed while filling the storage node electrode forming hole 151. The sacrificial capping layer 170 may be formed of an insulation layer having a good gap-filling property, e.g., an oxide layer. Examples of material for forming the sacrificial layer 170 may include BPSG, PSG, USG (Undoped Silicate Glass), or the like.

Figure 6:
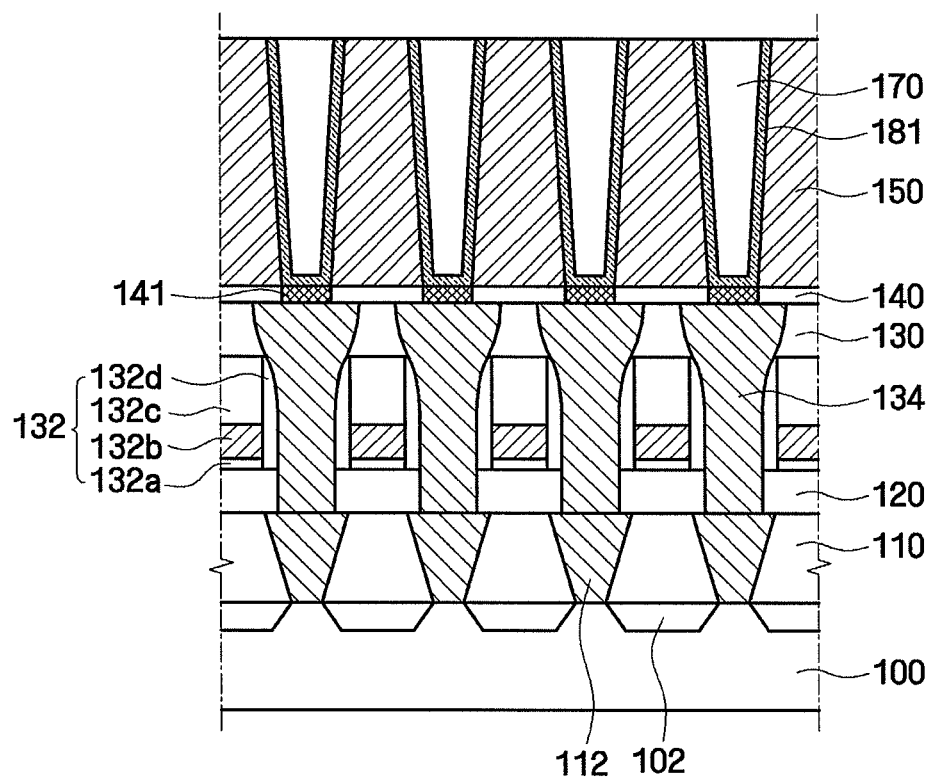

Referring to FIG. 6, a planarization process for removing portions of the sacrificial capping layer 170 and the conductive layer 160 for forming a storage node electrode may be performed until the molding insulation layer 150 is exposed. The planarization process may be performed by a CMP process or an etch back process. In such a manner, the storage node electrode 181 is completed.

Figure 7:
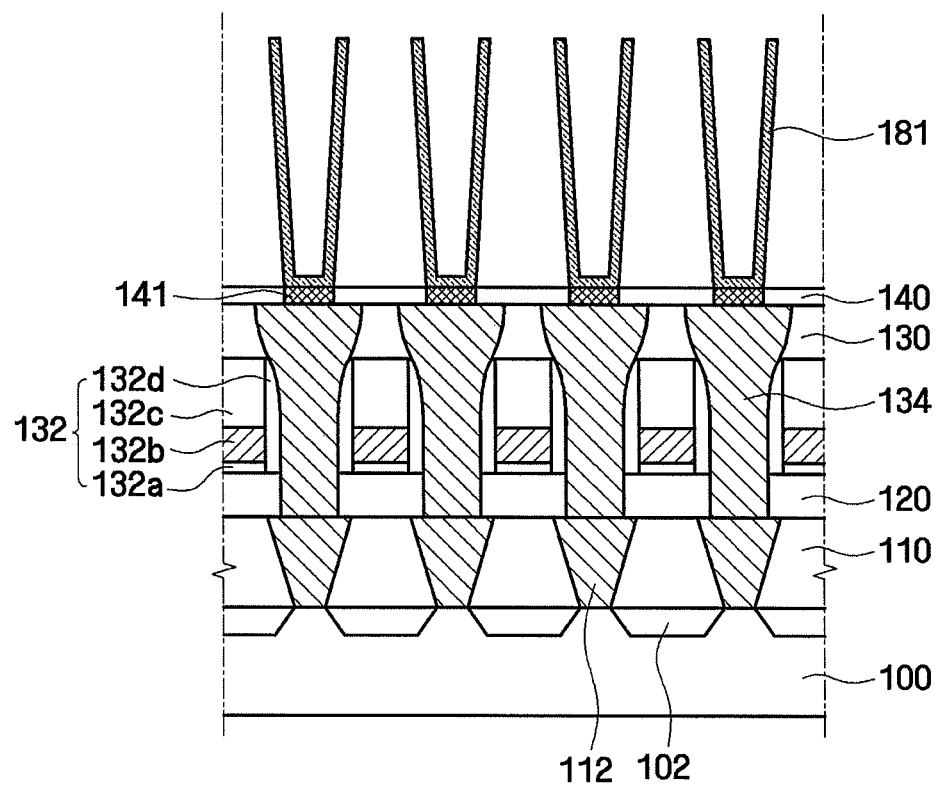

Subsequently, referring to FIG. 7, the molding insulation layer 150 and the sacrificial capping layer 170 remaining in the storage node electrode forming hole (151 of FIG. 5) may be removed. The removing of the molding insulation layer 150 and the sacrificial capping layer 170 may be performed, e.g., by wet etching using fluoric acid or a BOE containing mixture of HF and $NH_4F$. After the wet etching, a general drying process may be performed.

Figure 8:
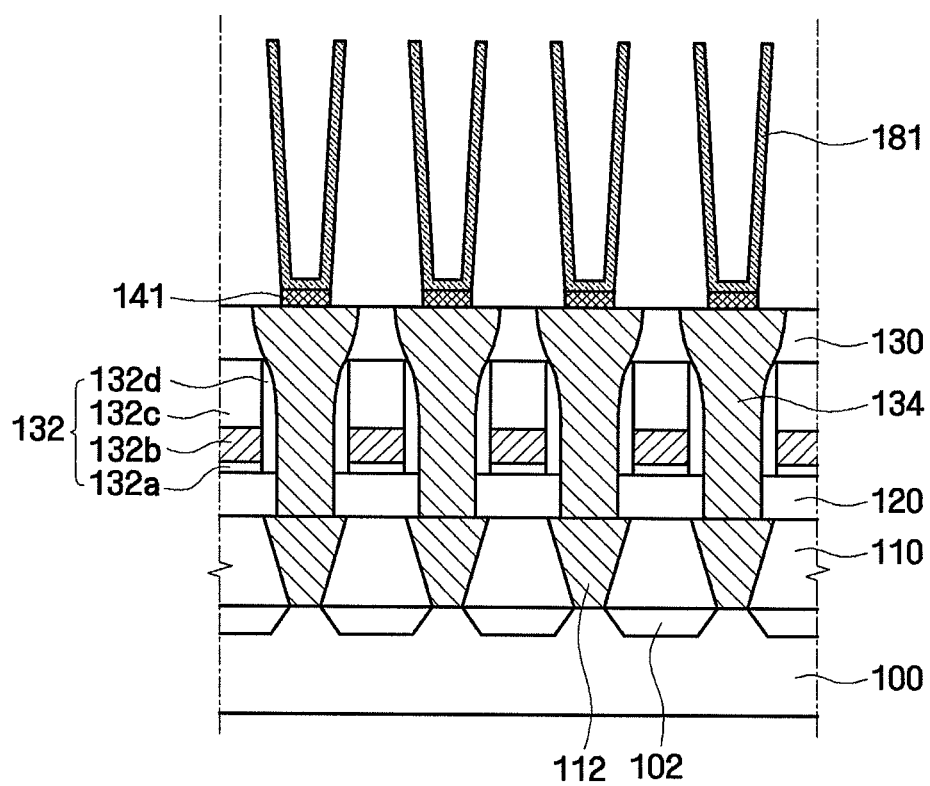

Next, referring to FIG. 8, the predetermined area of the etch stop layer 140 that does not react with the conductive layer for a storage node electrode (160 of FIG. 4) may be removed. That is, portions of the etch stop layer 140 that were not formed into the silicide pattern 141, i.e., portions of the etch stop layer 140 between adjacent storage node electrodes 181, may be removed to expose an underlying layer, e.g., portions of the third interlayer insulation layer 130 and the storage node contact plug 134.

The removing of the etch stop layer 140 may be performed by wet etching or dry etching using an etching solution or etching gas having high etching selectivity to the storage node electrode 181, the storage node contact plug 134, and the third interlayer insulation layer 130. The wet etching may be performed using a $NH_3$ based etching solution, e.g., $NH_4OH$, tetramethyl ammonium hydroxide (TMAH), and so on. The dry etching may be performed using a $CF_4/O_2$ gas or HBr gas. Since the etching solution or etching gas used for removing the etch stop layer 140 formed of a Si layer or a SiGe layer has higher etching selectivity with respect to the etch stop layer 140 than to the storage node electrode 181, the storage node contact plug 134, or the third interlayer insulation layer 130, the etch stop layer 140 that is not formed into the metal silicide pattern 141 may be easily removed.

Figure 9:
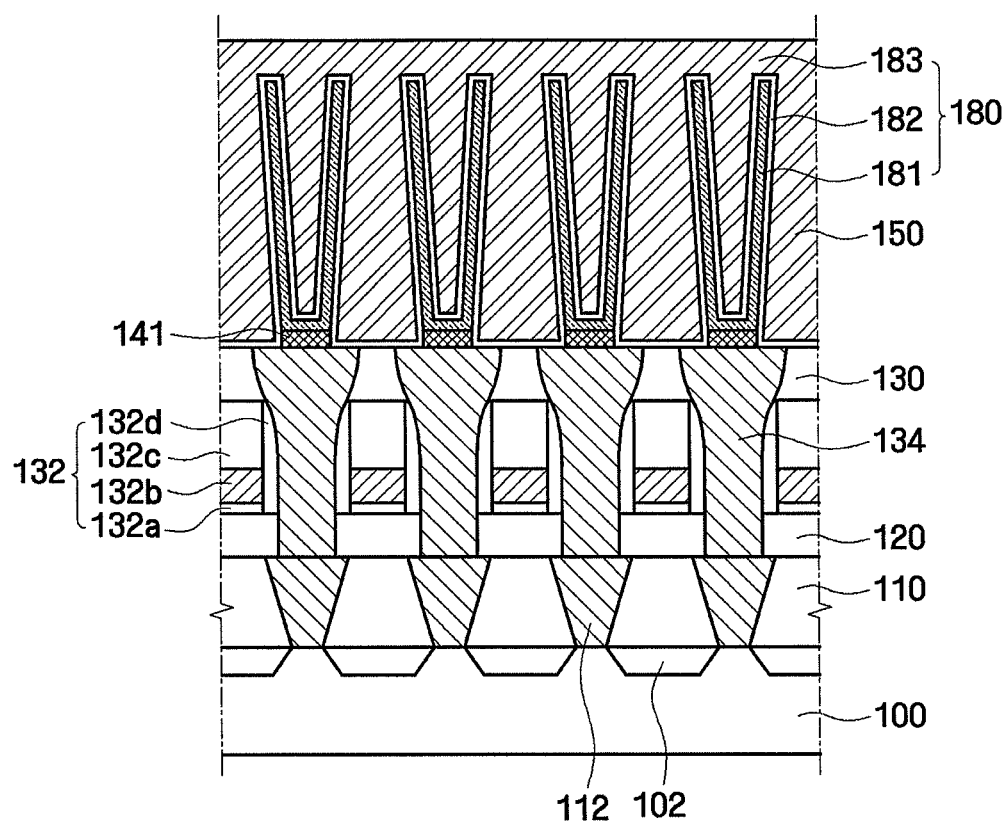

Referring to FIG. 9, a dielectric layer 182 may be deposited conformally on surfaces of the third interlayer insulation layer 130, the storage node contact plug 134, the metal silicide pattern 141, and the storage node electrode 181. For example, the dielectric layer 182 may be formed of a high-k dielectric layer, e.g., a tantalum oxide layer ($Ta_2O_5$), an aluminum oxide layer ($AlO_3$), or a hafnium oxide layer ($HfO_2$). The dielectric layer 182 may also be formed of a single layer or a dual layer.

Next, an upper electrode 183 may be formed on the dielectric layer 182 to complete a capacitor 180. The upper electrode 183 may be formed of, e.g., a single layer of Ru, Ir, Ti, TiN, Co, Rh, Os, Pd, Pt, W, Mo, Ta, TaN, Al, or Cu, or a composite layer made of these metals. Additionally, the upper electrode 183 may be formed of a material the same as or different from the storage node electrode 181.

Therefore, in the fabricating method of the semiconductor device according to the example embodiment, the storage node electrode forming hole 151 may not be formed in the etch stop layer 140, thereby avoiding shrinkage of the hole 151, e.g., as compared to conventional methods. As such, the size of a lower portion of the storage node electrode forming hole 151 may be sufficiently wide to provide sufficient area for the storage node electrode 181, and the dielectric layer 182 may be deposited at the lower portion of the storage node electrode forming hole 151 in a stable manner. In addition, the metal silicide pattern 141 may be formed by annealing in a predetermined area of the etch stop layer 140 exposed by the storage node electrode forming hole 151, thereby reducing contact resistance between the storage node contact plug 134 and the conductive layer 160 for a storage node electrode. Further, since the etching solution or etching gas used for removing the etch stop layer 140 formed of a Si layer or a SiGe layer has higher etching selectivity to the etch stop layer 140 than the storage node electrode 181, the storage node contact plug 134 and the third interlayer insulation layer 130, the etch stop layer 140 that is not formed into the metal silicide pattern 141 may be easily removed.

A fabricating method of a semiconductor device according to another embodiment will now be described in detail with reference to FIGS. 10 through 14. FIGS. 10 through 14 illustrate cross-sectional views of process steps of a fabricating method of a semiconductor device according to another embodiment. In the following description, since elements and processing conditions are substantially the same as those of the previous embodiment, a detailed explanation of same elements or steps will not be repeated and only differences will be described.

Figure 10:
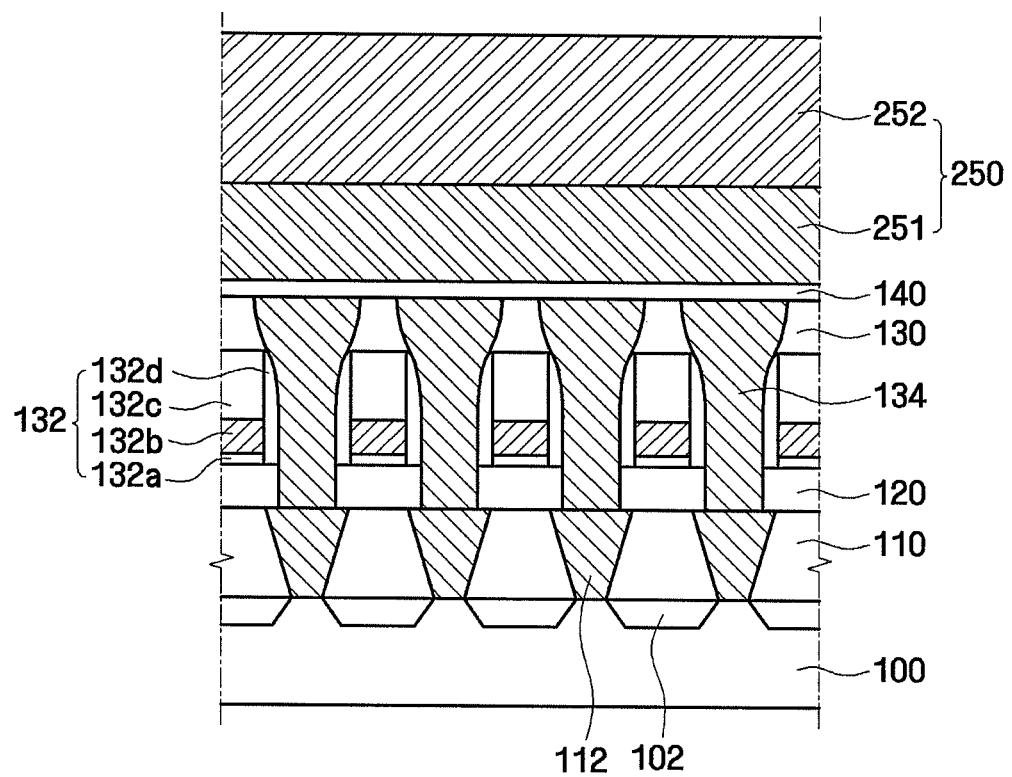
FIGS. 10 through 14 illustrate cross-sectional views of process steps of a fabricating method of a semiconductor device according to another embodiment.

Referring to FIG. 10, in the fabricating method of a semiconductor device according to another embodiment, a molding insulation layer 250 having multiple layers may be formed on an etch stop layer 140. For example, the molding insulation layer 250 may include a first molding insulation layer 251 and a second molding insulation layer 252. The first and second molding insulation layers 251 and 252 may be formed of silicon oxide based layers. In addition, the first and second molding insulation layers 251 and 252 may be formed to have different etch rates during wet etching by varying concentrations of doped impurities. Examples of the silicon oxide layer may include, but are not limited to, a BPSG layer, a PSG layer, a PE-TEOS layer, a HDP oxide layer, a P-SiH4 oxide layer, and so on. It is noted that although FIG. 10 shows that the molding insulation layer 250 is formed of a dual layer, aspects of the example embodiments are not limited thereto. The molding insulation layer 250 may also be formed of multiple layers of three or more layers.

Figure 11:
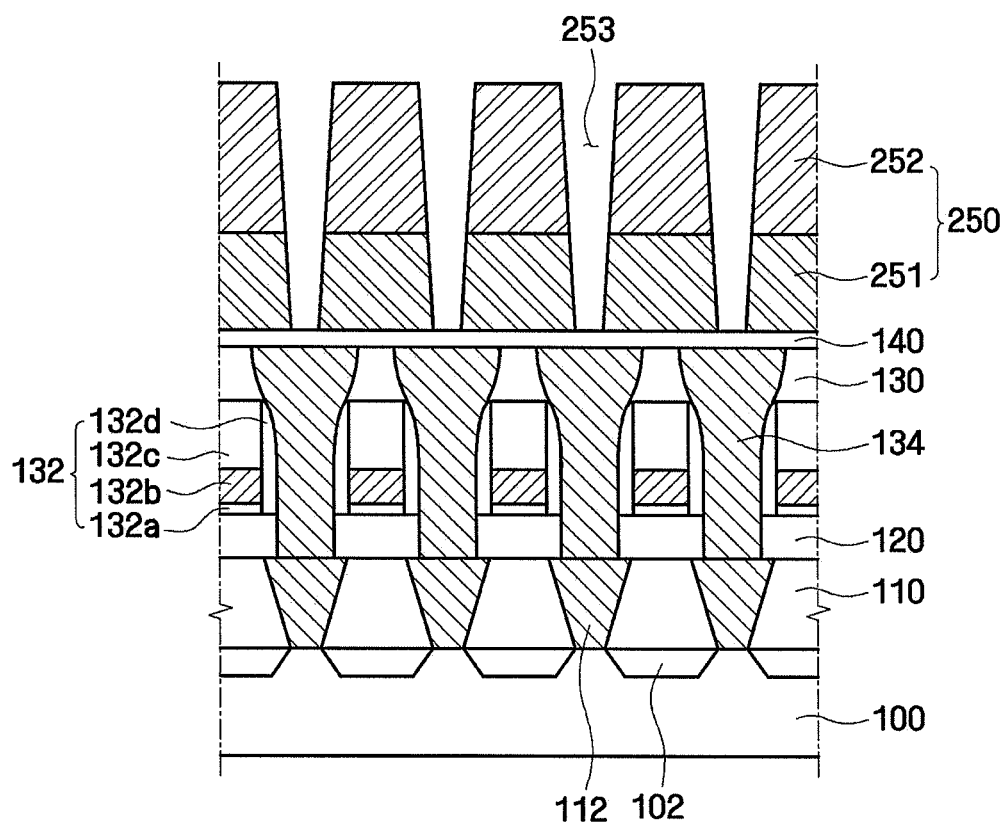

Referring to FIG. 11, the first and second molding insulation layers 251 and 252 may be selectively etched to form a hole 253 for forming a storage node electrode, which passes through the first and second molding insulation layers 251 and 252. The storage node electrode forming hole 253 may be formed by anisotropic dry etching.

Figure 12:
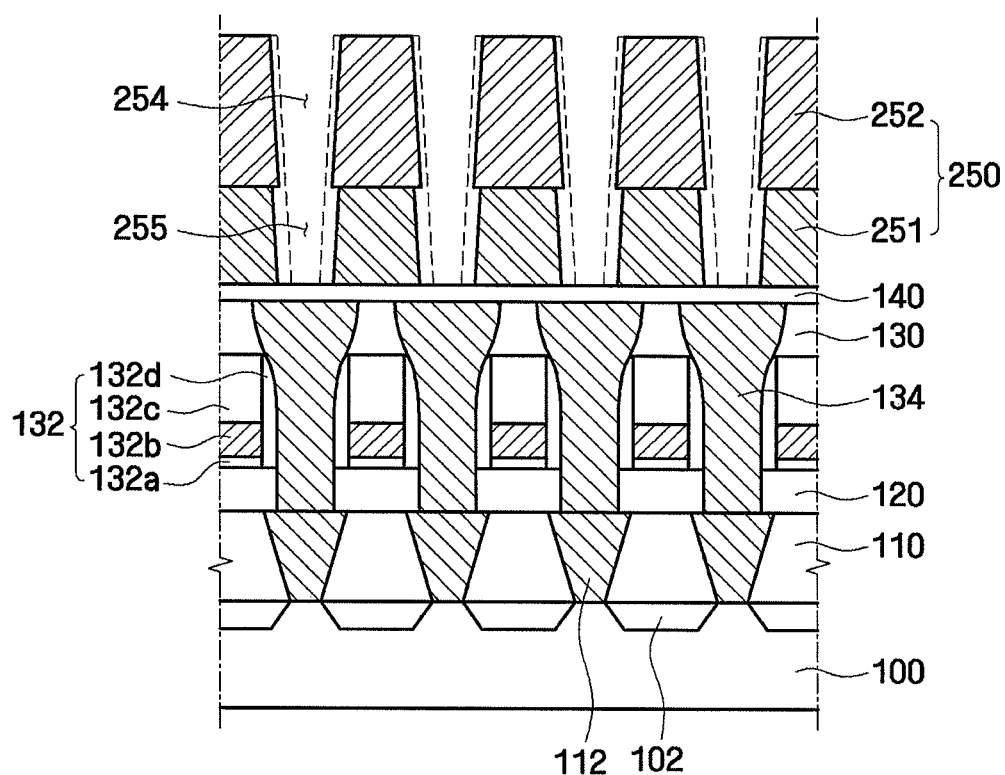

Next, referring to FIG. 12, the storage node electrode forming hole 253 formed in the first and second molding insulation layers 251 and 252 may further be enlarged. The enlarging of the storage node electrode forming hole 253 may be performed by wet etching. Here, the enlarging of the storage node electrode forming hole 253 may be performed by using an etching solution having higher etching selectivity with respect to the first molding insulation layer 251, thereby forming a first storage node electrode forming hole 255 in the first molding insulation layer 251 to have a greater width than a second storage node electrode forming hole 254 in the second molding insulation layer 252. Examples of the etching solution may include fluoric acid, APM such as SC-1 ($NH_4OH+H_2O_2$+deionized water) or a BOE containing a mixture of HF and $NH_4F$.

Figure 13:
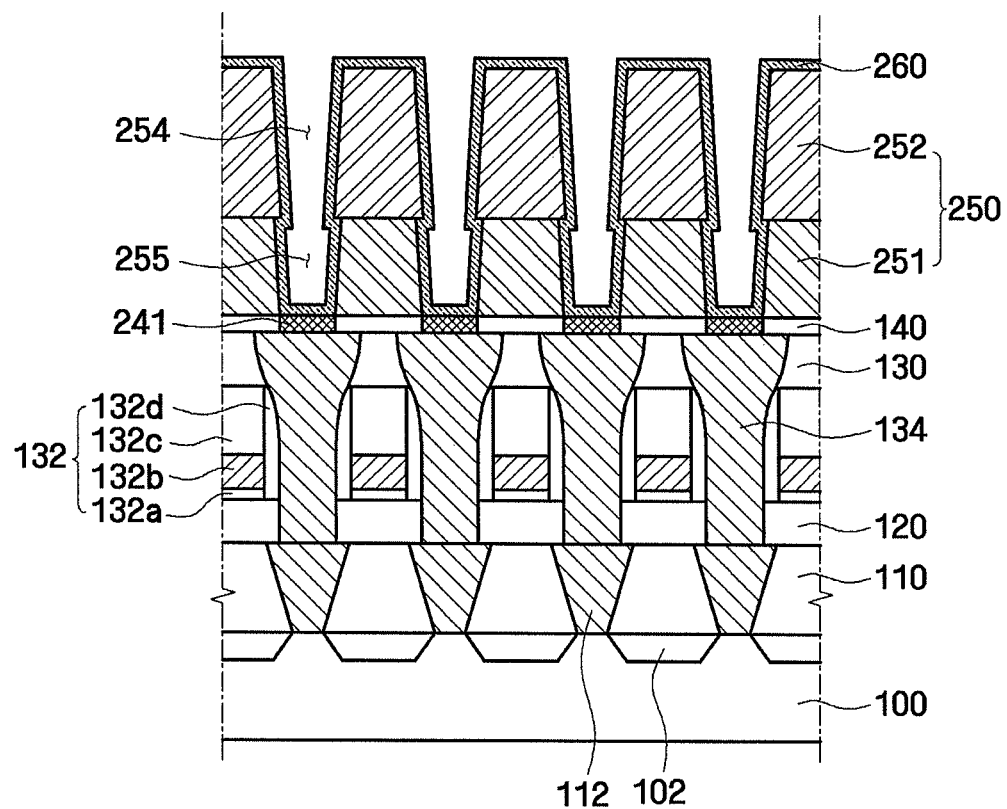
Figure 14:
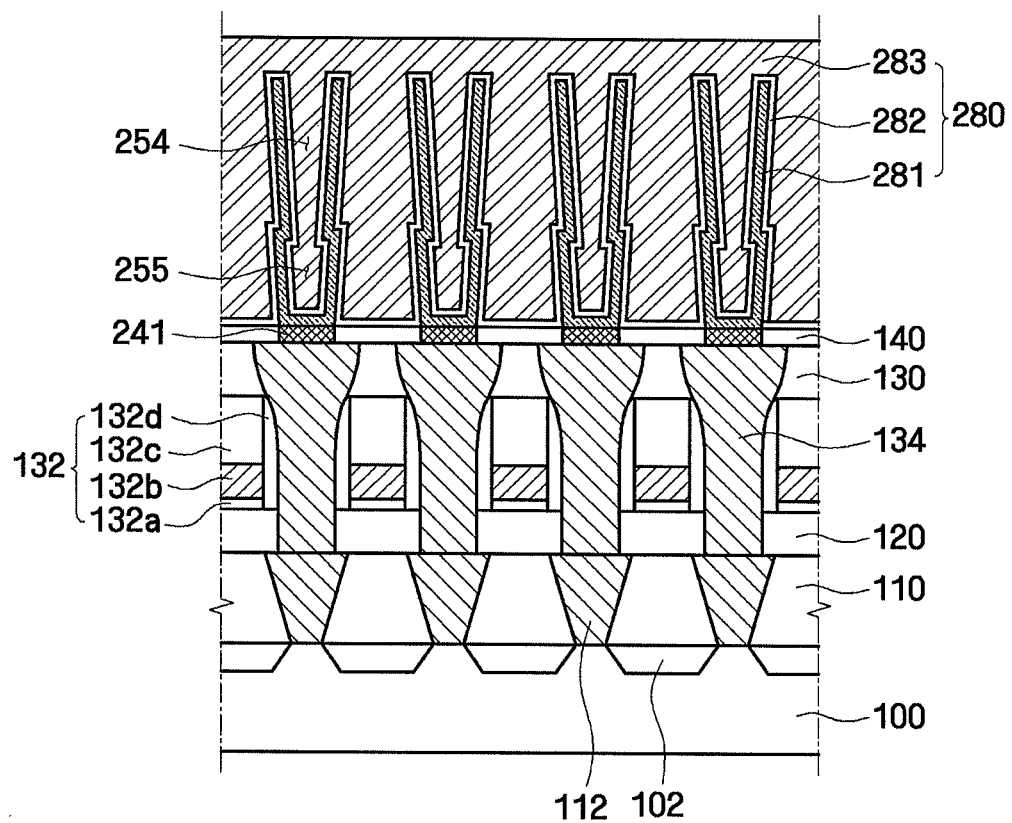

Referring to FIG. 13, a conductive layer 260 for forming a storage node electrode may be formed conformally on the inner surface of the first and second storage node electrode forming holes 254 and 255 and the top surface of the second molding insulation layer 252. The conductive layer 260 for forming a storage node electrode may be formed of a metal layer. The conductive layer 260 for a storage node electrode may be formed of, e.g., a single layer of Ru, Ir, Ti, TiN, Co, Rh, Os, Pd, Pt, W, Mo, Ta, TaN, Al, or Cu, or a composite layer of these elements.

Subsequently, annealing may be performed on the substrate 100 having the conductive layer 260 for a storage node electrode to allow the predetermined area of the etch stop layer 140 exposed by the storage node electrode forming holes 254 and 255 to react with the conductive layer 260 for a storage node electrode, thereby forming a metal silicide pattern 241 in the predetermined area of the etch stop layer 140. The annealing may be performed, e.g., by a RTN process under a nitrogen ($N_2$) atmosphere at a temperature in a range of about 500° C. to about 900° C. The metal silicide pattern 241 may overlap and directly contact the storage node contact plug 134.

Next, a capacitor 280 including a storage node electrode 281, a dielectric layer 282, and an upper electrode 283 may be formed by the same procedure as shown in FIGS. 5 through 9.

Since the storage node electrode forming holes 254 and 255 are not formed in the etch stop layer 140, it may be possible to prevent lower portions of the storage node electrode forming holes 254 and 255 from shrinking in the etch stop layer 140, thereby securing a sufficient size of a lower portion of the storage node electrode 281. In addition, since predetermined areas of the etch stop layer 140 exposed by the storage node electrode forming holes 254 and 255 are formed into the metal silicide pattern 141, contact resistance between the storage node contact plug 134 and the storage node electrode 281 may be reduced.

Figure 15:
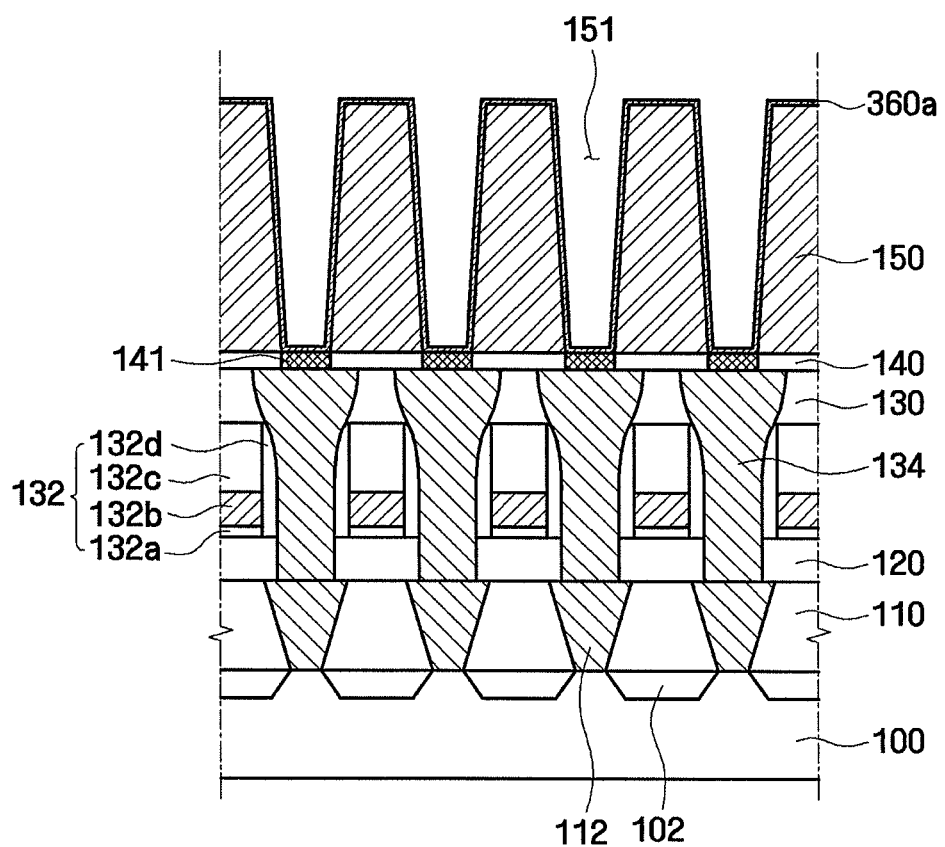
FIGS. 15 and 16 illustrate cross-sectional views of process steps of a fabricating method of a semiconductor device according to another embodiment.
Figure 16:
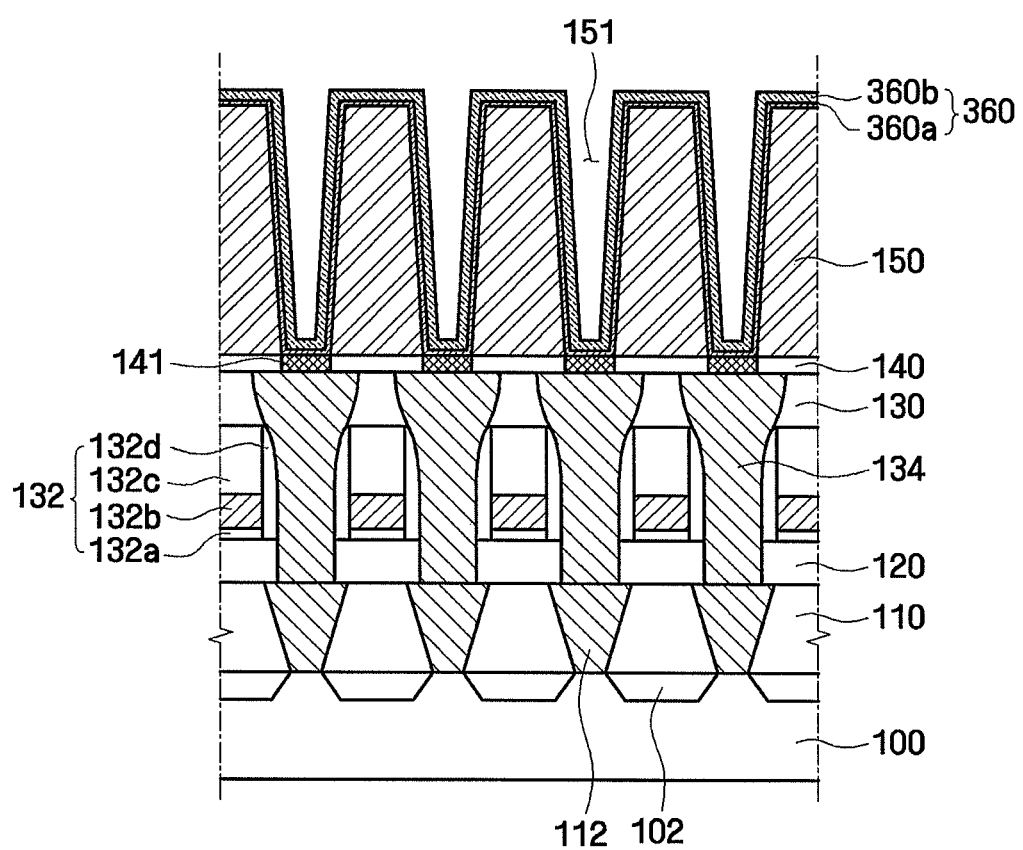

A fabricating method of a semiconductor device according to still another embodiment will now be described in detail with reference to FIGS. 15 and 16. FIGS. 15 and 16 illustrate cross-sectional views of process steps of a fabricating method of a semiconductor device according to still another embodiment. In the following description, since processing conditions are substantially the same as those of the previous embodiments, a detailed explanation of same elements or procedures will not be repeated.

Referring to FIG. 15, in the fabricating method of a semiconductor device according to still another embodiment, a first conductive layer 360a for a storage node electrode may be conformally formed in holes 151 of the molding insulation layer 150 described previously with reference to FIGS. 1-3. hen, annealing may be performed to form a metal silicide pattern 141 from a predetermined area of the etch stop layer 140. The first conductive layer 360a for a storage node electrode may be formed of a metal layer, e.g., a single layer of Ru, Ir, Ti, TiN, Co, Rh, Os, Pd, Pt, W, Mo, Ta, TaN, Al, or Cu, or a composite layer of these elements. The annealing may be performed, e.g., by a RTN process under a nitrogen ($N_2$) atmosphere at a temperature in a range of about 500° C. to about 900° C.

Next, referring to FIG. 16, a second conductive layer 360b for a storage node electrode may be formed on the first conductive layer 360a for a storage node electrode. The second conductive layer 360b for a storage node electrode may be formed of a metal layer or an impurity doped conductive silicon layer. Since the metal silicide pattern 141 is formed using the first conductive layer 360a for a storage node electrode, the second conductive layer 360b for a storage node electrode may be formed using an impurity doped conductive silicon layer. Examples of the metal layer may includes a single layer of Ru, Ir, Ti, TiN, Co, Rh, Os, Pd, Pt, W, Mo, Ta, TaN, Al, or Cu, or a composite layer of these elements.

A conductive layer 360 for a storage node electrode may be formed from the first conductive layer 360a for a storage node electrode and the second conductive layer 360b for a storage node electrode. The first conductive layer 360a for a storage node electrode and the second conductive layer 360b for a storage node electrode may be made of the same material or different materials. For example, the first conductive layer 360a for a storage node electrode may be made of Ti and the second conductive layer 360b for a storage node electrode may be made of TiN.

After the first conductive layer 360a for a storage node electrode is allowed to react with the etch stop layer 140 to form the metal silicide pattern 141 and before the second conductive layer 360b for a storage node electrode is deposited, the first conductive layer 360a for a storage node electrode may be removed. Next, the same procedure shown in FIGS. 5 through 9 is performed.

Therefore, according to example embodiments, a method for fabricating a semiconductor device may improve resistance characteristics between a storage node contact plug and a storage node electrode. In contrast, when a conventional cylinder type storage electrode is highly integrated, a size of an inner hole may decrease, i.e., a region where electrodes and dielectric of a capacitor are deposited, as the design rule decreases and as a height of the storage electrode increases. When the size of the inner hole is reduced, deposition of a dielectric layer on surfaces thereof may be non-uniform. Additionally, if the size of the inner hole is reduced, a contact area between a storage node contact plug and the storage node electrode may be reduced, thereby increasing resistance therebetween and lowering the device speed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A fabricating method of a semiconductor device, comprising:
    forming an interlayer insulation layer on a substrate, the interlayer insulation layer including a storage node contact plug;
    forming an etch stop layer on the interlayer insulation layer, the etch stop layer including a silicon layer or a silicon germanium layer;
    forming a molding insulation layer on the etch stop layer;

forming a hole in the molding insulation layer by selectively etching the molding insulation layer until a portion of the etch stop layer is exposed;

forming a first conductive layer conformally on an inner surface of the hole and on a top surface of the molding insulation layer;

forming a metal silicide pattern in a predetermined area of the etch stop layer exposed by the molding insulation layer by annealing the first conductive layer and the etch stop layer;

after forming the metal silicide pattern, forming a second conductive layer on the first conductive layer; and after forming the metal silicide pattern and before forming the second conductive layer, removing the first conductive layer.

2. The fabricating method as claimed in claim 1, wherein forming the first conductive layer includes forming a metal layer.

3. The fabricating method as claimed in claim 2, wherein forming the metal layer includes depositing at least one layer of Ru, Ir, Ti, TiN, Co, Rh, Os, Pd, Pt, W, Mo, Ta, TaN, Al, and Cu.

4. The fabricating method as claimed in claim 1, wherein forming the first conductive layer includes forming the first conductive layer in direct contact with the predetermined area of the etch stop layer exposed by the molding insulation layer.

5. The fabricating method as claimed in claim 1, wherein the annealing is performed by a rapid thermal nitridation (RTN) process under a nitrogen ($N_2$) atmosphere at a temperature in a range of about 500° C. to about 900° C.

6. The fabricating method as claimed in claim 1, further comprising, after forming the hole in the molding insulation layer, enlarging the hole by an isotropic etching process.

7. The fabricating method as claimed in claim 1, further comprising, after forming the metal silicide pattern:
    forming a sacrificial capping layer on the first conductive layer;
    removing portions of the sacrificial capping layer and the first conductive layer by a planarization process until the molding insulation layer is exposed;
    removing the molding insulation layer and residues of the sacrificial capping layer remaining in the hole; and
    removing a predetermined region of the etch stop layer not reacting with the first conductive layer.

8. The fabricating method as claimed in claim 7, wherein removing the predetermined region of the unreacted etch stop layer includes performing wet etching using a $NH_3$ based etching solution.

9. The fabricating method as claimed in claim 7, wherein removing the predetermined region of the unreacted etch stop layer includes performing dry etching using $CF_4/O_2$ gas or HBr gas.

10. The fabricating method as claimed in claim 1, wherein forming the molding insulation layer includes sequentially forming a first molding insulation layer and a second molding insulation layer on the etch stop layer.

11. The fabricating method as claimed in claim 10, further comprising, after forming the hole in the molding insulation layer, enlarging the hole by wet etching.

12. The fabricating method as claimed in claim 11, wherein enlarging the hole includes using a wet etching solution having different etching selectivity with respect to each of the first and second molding insulation layers.

13. The fabricating method as claimed in claim 12, wherein enlarging the hole is performed using fluoric acid, APM (ammonium peroxide mixture), or a buffered oxide etchant (BOE) containing a mixture of HF and $NH_4F$.

14. The fabricating method as claimed in claim 12, wherein forming the first and second molding insulation layers includes sequentially forming silicon oxide layers with different impurity concentrations.

15. The fabricating method as claimed in claim 14, wherein forming each of the first and second molding insulation layers includes using BPSG (Boron Phosphorus Silicate Glass), PSG (Phosphorus Silicate Glass), PE-TEOS (Plasma Enhanced Tetra Ethyl Ortho Silicate), HDP (High Density Plasma) oxide, or $P-SiH_4$ oxide.

16. The fabricating method as claimed in claim 1, wherein forming the second conductive layer includes depositing a metal layer or an impurity doped conductive silicon layer.

17. A fabricating method of a semiconductor device, comprising:
    forming an interlayer insulation layer on a substrate, the interlayer insulation layer including a storage node contact plug;
    forming an etch stop layer on the interlayer insulation layer;
    forming a molding insulation layer on the etch stop layer;
    forming a hole through the molding insulation layer, such that a portion of the etch stop layer is exposed through the hole;
    conformally forming a conductive layer on an inner surface of the hole, such that the conductive layer contacts the exposed etch stop layer; and
    annealing the conductive layer with the etch stop layer, such that a metal silicide pattern is formed between the conductive layer and the storage node contact plug of the interlayer insulation layer;
    after forming the metal silicide pattern, forming a second conductive layer on the first conductive layer; and
    after forming the metal silicide pattern and before forming the second conductive layer, removing the first conductive layer.

18. The fabricating method as claimed in claim 17, wherein forming the hole in the molding insulation layer includes forming a bottom of the hole and a bottom of the molding insulation layer substantially level.

* * * * *